US007626318B2

(12) United States Patent
Dalla Piazza et al.

(10) Patent No.: US 7,626,318 B2
(45) Date of Patent: Dec. 1, 2009

(54) PIEZOELECTRIC RESONATOR WITH OPTIMISED MOTIONAL CAPACITANCES

(75) Inventors: Silvio Dalla Piazza, St-Imier (CH); Bruno Studer, Riedholz (CH); Felix Staub, Koppigen (CH)

(73) Assignee: ETA SA Manufacture Horlogère Suisse, Grenchen (CH)

( * ) Notice: Subject to any disclaimer, the term of this patent is extended or adjusted under 35 U.S.C. 154(b) by 0 days.

(21) Appl. No.: 12/176,154

(22) Filed: Jul. 18, 2008

(65) Prior Publication Data

US 2009/0021120 A1    Jan. 22, 2009

(30) Foreign Application Priority Data

Jul. 19, 2007   (EP)   ................... 07014189

(51) Int. Cl.
*H01L 41/08* (2006.01)
(52) U.S. Cl. ...................................... 310/370
(58) Field of Classification Search ................. 310/344, 310/348, 366, 370
See application file for complete search history.

(56) References Cited

U.S. PATENT DOCUMENTS

| 3,683,213 | A | * | 8/1972 | Staudte | ........................ 310/312 |
| 4,384,232 | A | | 5/1983 | Debely | |
| 6,262,520 | B1 | * | 7/2001 | Knowles | ..................... 310/370 |
| 6,587,009 | B2 | * | 7/2003 | Kitamura et al. | ............. 331/158 |
| 6,768,247 | B2 | * | 7/2004 | Kitamura et al. | ............. 310/370 |
| 6,791,243 | B2 | * | 9/2004 | Kawashima | ................. 310/370 |
| 7,253,554 | B2 | | 8/2007 | Dalla Piazza et al. | |
| 2006/0049722 | A1 | | 3/2006 | Dalla Piazza et al. | |

FOREIGN PATENT DOCUMENTS

| EP | 1 633 042 A1 | 3/2006 |
| EP | 1 650 866 A2 | 4/2006 |
| JP | 2005-005896 | 1/2005 |

OTHER PUBLICATIONS

European Search Report issued in corresponding application No. EP 07 01 4189, completed Jan. 9, 2008.

* cited by examiner

*Primary Examiner*—Mark Budd
(74) *Attorney, Agent, or Firm*—Griffin & Szipl, P.C.

(57) ABSTRACT

The tuning fork resonator (1) includes a base (4) from which first and second parallel vibrating arms (2, 3) extend, carrying a set of excitation electrodes (5, 6) for vibrating the arms at a fundamental frequency. Grooves (7, 8) are formed on at least one of the top or bottom surfaces of each of said arms. The vibrating arms have a generally tapered shape, and are extended by an enlarged flipper shaped portion (9, 10) which forms the free end of each arm. The groove (7, 8) is extended in the direction of the free end of an arm to beyond the start of the flipper (9, 10) so as to increase said first motional capacitance of the resonator for the fundamental frequency, to decrease said second motional capacitance of the resonator for the partial frequency and to ensure better distribution of mechanical stress along the vibrating arms and to increase shock resistance.

9 Claims, 2 Drawing Sheets

PIEZOELECTRIC RESONATOR WITH OPTIMISED MOTIONAL CAPACITANCES

This application claims priority from European Patent Application No. 07014189.0, filed Jul. 19, 2007, the entire disclosure of which is incorporated herein by reference.

FIELD OF THE INVENTION

The present invention concerns piezoelectric resonators and more specifically resonators of small dimensions which are most often used for making frequency generators, in particular for portable electronic equipment used in various fields, such as horology, information technology, telecommunication and the field of medicine.

BACKGROUND OF THE INVENTION

Resonators of this type with small dimensions have already been disclosed in the prior art document U.S. Pat. No. 4,384,232, which is incorporated herein by reference. That document discloses a tuning fork resonator formed of a base and two vibrating arms extending from the base. Each arm carries metallised portions that form central electrodes on the main opposite surfaces and lateral electrodes along the sides of each arm. The central electrodes of one arm are connected to the lateral electrodes of the other arm and to one terminal of a power supply. The other central and lateral electrodes are connected in an identical manner to the other terminal of the power supply. The electrodes are subjected to electrical fields in order to make the arms vibrate at a desired fundamental frequency.

Grooves are provided in each arm. The arrangement of the central electrodes inside the grooves, in the thickness of the arms, increases the piezoelectric coupling. In equal dimensions, this increase in the coupling causes a decrease in the equivalent resistance for a given resonator quality factor and consequently a decrease in the power consumption thereof. This effect can be modelled as a result of the reduction in the series resistance representing losses in the equivalent conventional resonator circuit. Conversely, for the same desired equivalent resistance, this arrangement allows a reduction in the dimensions of the resonator.

These grooves are advantageously as deep as possible provided that the resonator maintains good mechanical resistance. The zones arranged between the grooves and the lateral edges of the arms must remains sufficiently rigid and must also remain connected to the central part of the arms in a sufficiently rigid manner so as to be able to make the whole of the tuning fork vibrate.

Owing to the use of these grooves, it is possible to attain a higher degree of miniaturisation, for the same given frequency and for the same given equivalent resistance. However, below a certain dimension, the decrease in volume of the elastically active piezoelectric material is associated with a decrease in quality factor, which causes an undesirable increase in the equivalent resistance.

It is thus an object of the present invention to provide a piezoelectric resonator that can be miniaturised as much as possible without causing an excessive increase in the equivalent resistance.

Moreover, a piezoelectric resonator of the type described above has a motional capacitance that can be defined as being proportional to the integral of the stresses for each resonance mode, i.e. for a fundamental frequency resonance mode, but also for harmonic frequency resonance modes and more specifically for a first partial frequency resonance mode. It is thus another object of this invention to provide a piezoelectric resonator that has a maximum motional capacitance for the fundamental frequency and a minimum motional capacitance for the partial frequency, which is the frequency that may be started accidentally by the oscillator circuit.

SUMMARY OF THE INVENTION

This invention achieves the objects cited above by providing a piezoelectric tuning fork resonator in accordance with the annexed claim 1.

It will be understood that a piezoelectric tuning fork resonator of the type described in the preamble of claim 1 has in particular a first motional capacitance for a first frequency, called the fundamental frequency, and a second motional capacitance for a second frequency, called the partial frequency. It will also be understood that the features forming the subject of this invention advantageously allow said first motional capacitance of the resonator to be increased for the fundamental frequency, and said second motional capacitance to be decreased for the partial frequency. They also ensure better distribution of the mechanical stress along the vibrating arms and increase shock resistance.

In particular, it will be understood that according to this invention, the distribution of the mass forming the vibrating arms differs considerably from the prior art. Indeed, this invention provides that the vibrating arms have a tapered shape and end in an enlarged portion called a flipper. One advantage of this distribution of the mass is to raise the quality factor as much as possible. The effect of the flippers, in particular, is to lower the frequency for a given arm length, and thus allow the frequency to be adjusted to the desired value.

Another advantage linked to the presence of the flippers is that it does not favour resonance in the partial frequency mode. In fact, the effect of the flippers is to couple the partial frequency mode with torsion modes about the axis of symmetry of the arm. The effect of this is to decrease the actual motional capacitance of that mode.

The presence of the grooves causes a decrease in equivalent resistance for a given resonator quality factor. However, the grooves only have a secondary effect on the quality factor per se.

It will also be understood that, according to this invention, the grooves extend along the arms beyond the point of enlargement that coincides with the start of the flippers. In fact, the point of enlargement that coincides with the start of the flippers forms a zone of maximum stress in the event of any shock. In these circumstances, owing to the features of this invention, the fragile end of the groove is at a certain distance from the zone of maximum stress in the event of a shock. Moreover, the fact that the grooves extend beyond the start of the flippers enables the motional capacitance of the resonator to be increased by better distributing the stresses associated with vibration, and the with the mass of the flippers.

According to an advantageous embodiment of this invention, the grooves start within base 4 well before the anchorage zone of the arms.

Moreover, according to another advantageous embodiment of this invention, the length of the base is comprised between 4.5 and 6.5 times the mean width of a vibrating arm. Tests carried out by the Applicant have in fact demonstrated that failure to observe this ratio may lead to assembly sensitivity effects, and to instabilities in the equivalent frequency and/or resistance. Indeed, even in the case of extreme miniaturisation, connection surfaces, whose dimension is dependent upon fixing technology, have to be provided. It is also necessary to guarantee a minimum distance between the fixing zone and the elastically active zone of the resonator, in order to have the most efficient mechanical uncoupling possible.

Preferably, the length of the base equates approximately to 6 times the mean width of a vibrating arm.

Within the scope of this invention, several experiments with different groove depths have demonstrated that the motional capacitance of the resonator is much more sensitive when the groove is deep. Thus, for a groove depth of between 40 and 50% of the vibrating arm thickness, the motional capacitance of the resonator for the fundamental frequency is too sensitive to manufacturing tolerances and the entire structure of the resonator is too fragile. A groove depth that equates to a maximum of 40% of the thickness of the vibrating arms is thus preferable since it is a good compromise between the dimensions of the resonator and the resistance thereof to mechanical stress.

Although a groove thickness of between 30 and 40% of the vibrating arm thickness has some advantages, an arm with such a thickness may remain insufficiently resistant to mechanical stress and for increased security, a groove depth that equates to a maximum of 30% of the vibrating arm thickness seems more preferable.

Moreover, advantageously, the flippers are ballasted so that the fundamental frequency can be easily adjusted.

The grooves may be either of rectangular shape, to reduce the space between the electrodes and thus further increase the first motional capacitance, or of a tapered shape fitting the shape of the arms to prevent any short circuits between the electrodes.

BRIEF DESCRIPTION OF THE DRAWINGS

Other features and advantages of the invention will appear more clearly upon reading the following description with reference to the annexed drawings, in which:

FIG. 1a shows a cross-section along the line A-A of FIG. 1;

DETAILED DESCRIPTION OF THE INVENTION

The invention will be described below with reference to a non-limiting example given with reference to FIGS. 1 to 3.

Figure 1:
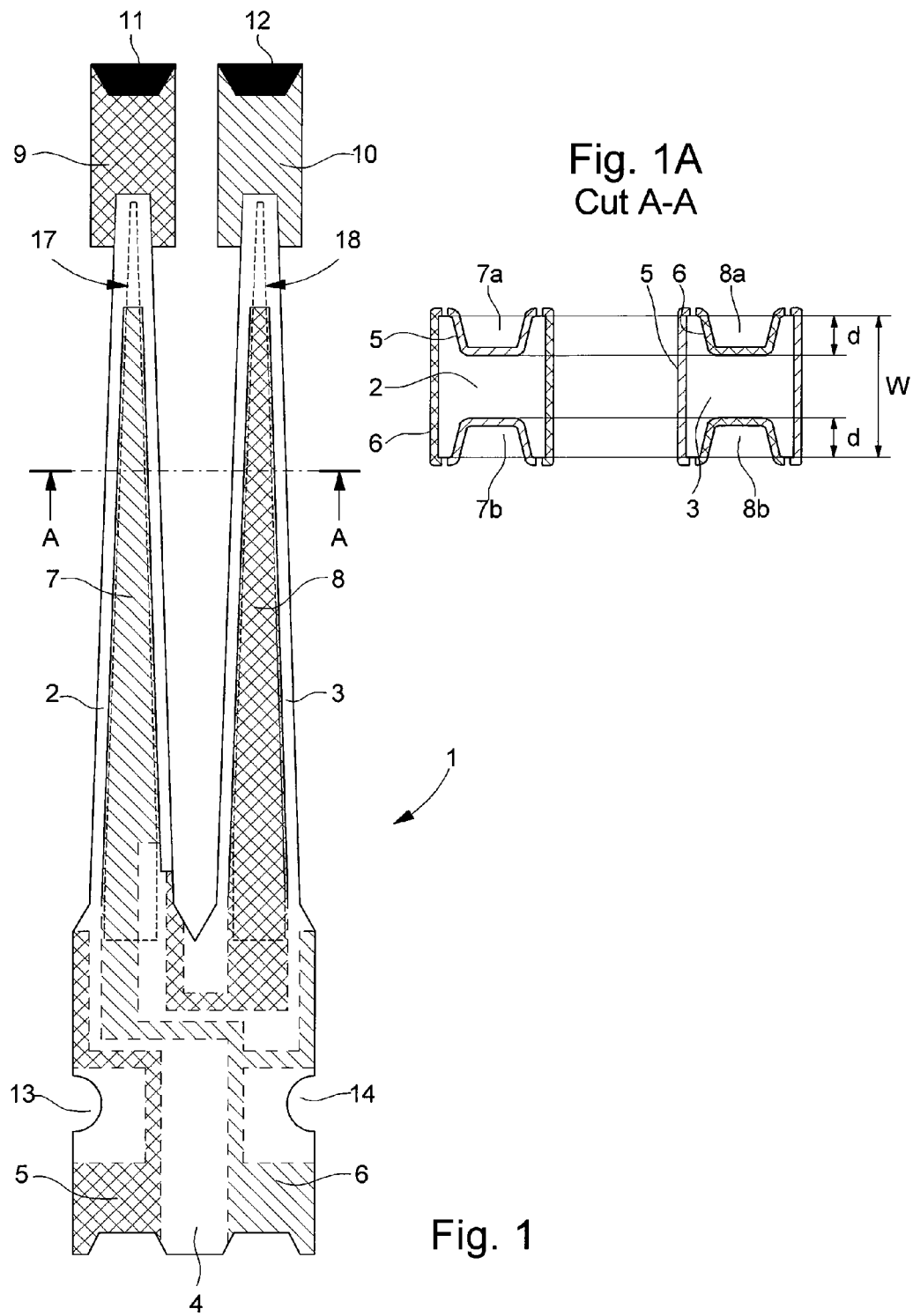
FIG. 1 shows a tuning fork resonator according to a particular embodiment of the present invention.

In the particular embodiment which is shown in FIG. 1, the resonator, designated by the reference 1, includes a tuning fork part including two vibrating arms 2 and 3 joined by a base 4, the assembly being made in a single piece in a piezoelectric material, such as quartz. Base 4 and arms 2 and 3 carry metallised portions, i.e. conductive depositions, which form a set of electrodes 5 and 6, which enable the arms to be subjected to electric fields in order to make them vibrate at a desired frequency, called the fundamental frequency. The metallised portions formed on the arms form the central electrodes on the main opposite surfaces and lateral electrodes along the sides of each arm. Grooves 7 and 8 are also formed in at least one of the front or back faces of each vibrating arm. The Figure shows that these grooves 7 and 8 start inside base 4 and extend along the arms to substantially beyond the point of enlargement that coincides with the start of the flippers 9 and 10. By thus altering the section of the arm over practically the entire length thereof, these grooves provide more precise performance, even when the device is miniaturised.

FIG. 1 also shows that the central electrodes of each arm are formed inside grooves 7, 8. One advantage of this arrangement of the central electrodes inside the grooves, in the thickness of the arms, is that it increases the piezoelectric coupling.

FIG. 1 shows that the thickness of vibrating arms 2 and 3 decreases over one section which represents most of the length of the arms. The fact that the vibrating arms include a main section of tapered shape has the advantage of better distributing the tension in the crystal and thus increasing the motional capacitance for the fundamental frequency, while decreasing the motional capacitance for the partial frequency. One can also see that the tapered part of each vibrating arm is capped with a wider flipper (referenced respectively 9 and 10). As these flippers form the end of vibrating arms 2 and 3, this further reduces the dimensions of arms 2 and 3 without altering the features of the resonator and while ensuring better distribution of the mechanical stress along the arms. Advantageously, an unbalanced mass 11 and 12 can also be added to flippers 9 and 10, so as to obtain better adjustment of the resonator fundamental frequency.

Moreover, FIG. 1 shows that in this example, the central electrodes stop before the start of flippers 9 and 10 and thus also considerably before the distal end of grooves 7 and 8. One advantage of this arrangement is that no electric energy is wasted in a zone where the motional capacitance is greatly reduced because of the relative rigidity of flippers 9 and 10.

Finally, in this particular embodiment, notches 13 and 14 have also been provided in the base portion 4 to improve the mechanical uncoupling between the vibrating arms and the fixed part of the base.

Preferably, the width w1 of the arm at the distal end of the tapered section (at the point of enlargement coinciding with the start of the flippers) is selected to be between 30 and 60% of the width w2 of the arm at the proximal end of the tapered section (at the junction with the base 4 of the resonator). Advantageously, a better compromise is obtained for a ratio between the two aforementioned widths w1 and w2 of between 45 and 55%.

Moreover, the width of the flipper is preferably comprised between 1.5 and 2.5 times the mean width of the tapered section of the arm.

Let us now consider FIG. 1a which is a cross-section of FIG. 1 along the line A-A which shows the two vibrating arms 2 and 3 in which grooves 7a, 7b, 8a, 8b are formed along the longitudinal direction of the tuning fork resonator. According to a variant, each arm could have only one groove on the frontal or back face thereof. Further, in order to ensure that the resonator structure has sufficient mechanical resistance, the groove should also be as shallow as possible. Moreover, these grooves should also be as deep as possible, either to ensure better equivalent resistance for a given quality factor, or to reduce the resonator dimensions for a desired equivalent resistance. The best compromise should be sought while taking account of the tapered shape of the vibrating arms.

Within the scope of the invention it has been shown that the depth of a groove is preferably less than 40% of the thickness w of the vibrating arms, and that this depth provides a good compromise between the dimensions of the resonator and the resistance thereof to mechanical stress. Although a groove depth comprised of between 30 and 40% of the thickness of a vibrating arm has some advantages, for greater security an optimised compromise between the dimensions of the resonator and the resistance thereof to mechanical stress is obtained for a groove depth d of less than 30% of the thickness w of the vibrating arms.

Figure 2:
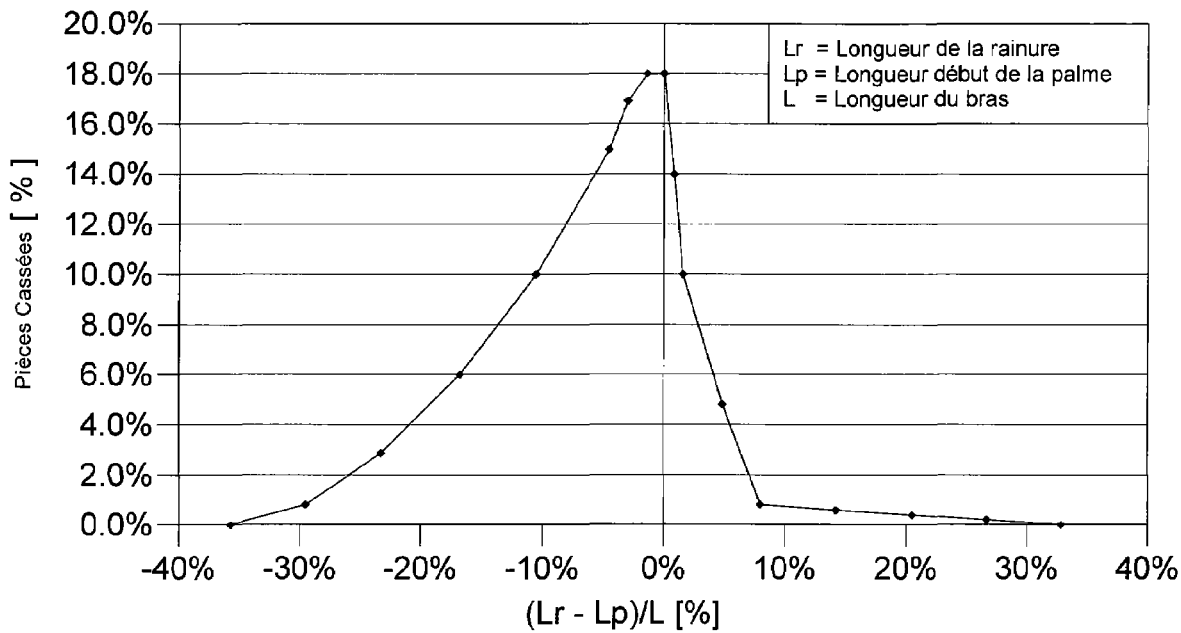
FIG. 2 is a graph showing the rate of parts broken at the flipper as a function of the position of the end of the groove relative to the start of the flippers.

FIG. 2 is a graph indicating the percentage of parts broken during shocks as a function of the position of the end of the groove. In this graph, Lr is the length to the end of the groove, Lp is the length at which the flipper starts, and L is the length of the arm. These three lengths are measured from the anchoring of the arm in the base.

As the Figure shows, the geometry of the grooves formed in the vibrating arms is determinant as regards the shock resistance of the oscillator. In fact, the graph indicates that the breakage rate is much higher when the distal end of the groove coincides with the point of enlargement marking the start of the flippers (Lp=Lr; abscissa 0% in the graph). A determining factor for explaining this phenomenon certainly lies in the effect of the considerable mass formed by the flippers. Another factor to be taken into consideration probably lies in the fact that the grooves are etched by etching the quartz crystal. In a known manner, a chemical etch tends to reveal multiple crystalline planes, in particular at the ends of the grooves. This multiplication of crystalline facets has the drawback of causing greater sensitivity to shocks, and to the stresses associated therewith.

Whatever the cause of the phenomenon, it seems advantageous to position the ends of the grooves outside the maximum stress zones associated with shocks. In order to do this, there are a priori two solutions. The first is to place the end of the grooves this side of the flippers, or to be more accurate, clearly before the point of enlargement of the arms. The second possibility, which forms the subject of this invention, is to place the end of the grooves clearly beyond the point of enlargement of the arms, such that the maximum stress zone associated with shocks is distributed over the lateral walls of the grooves.

Figure 3:
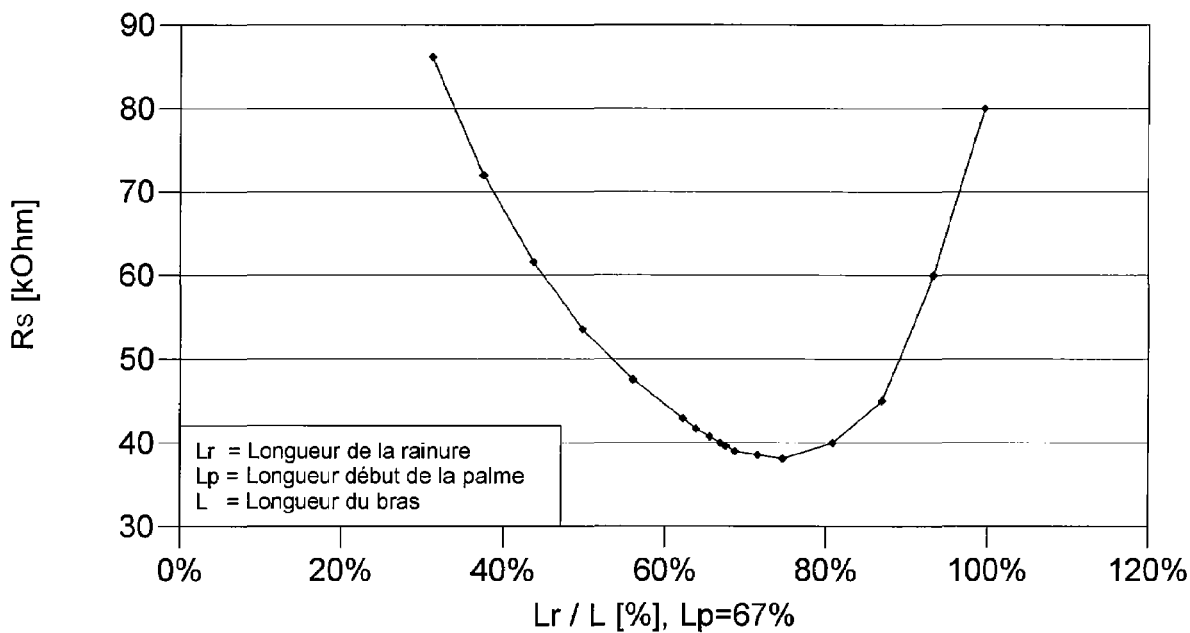
FIG. 3 is a graph showing the equivalent resistance as a function of the length of the groove for a length ratio at which the flipper starts of 67%.

FIG. 3 is a graph that gives the equivalent resistance as a function of the length of the groove in the particular case where, on each vibrating arm, the point of enlargement coinciding with the start of a flipper is located at 67% of the length of the arm (Lp/L=67%). It will be observed in FIG. 3 that the equivalent resistance has a minimum which is located not far from the abscissa 67%, i.e. close to the situation where the distal end of the groove coincides with the start of the flippers (Lp=Lr). Moreover, when the distal end of the groove is further away, practically at the end of an arm, the equivalent resistance increases because of the alteration in the mechanical properties of the flipper.

A closer examination of the graph shows however that the equivalent resistance is smaller when the groove extends a little beyond the start of the flipper than when the groove stops a little before the start of the flipper. According to this invention, the groove thus extends substantially beyond the start of the flipper so as to minimise simultaneously the broken part rate (FIG. 2) and the equivalent resistance (FIG. 3). Another advantage of this arrangement according to the invention is that it increases the motional capacitance of the resonator by better distributing the stresses associated with vibration, and the mass of the flippers.

Preferably, the distance over which a groove extends beyond the start of the flipper is comprised between one and two times the mean length of the arm. Moreover, this distance is advantageously at least three times the depth of the grooves. However, the end of the grooves is preferably closer to the start of the flippers than the end of the arms. This arrangement prevents both a rise in the equivalent resistance and activation of other vibration modes.

Although the invention has been described with reference to a specific embodiment, it will be understood that this embodiment does not constitute a restriction of the invention. Indeed, various alterations, adaptations and/or combinations of features may appear to those skilled in the art without departing from the scope of the invention, which is defined by the annexed claims. For example, the tapered shape of the electrodes shown in FIG. 1 could be replaced by a rectangular shape. In such case, the electrodes of rectangular shape reduce the space between the electrodes and thereby increase the motional capacitance of the fundamental oscillation mode.

What is claimed is:

1. A piezoelectric tuning fork resonator, including:
   a base; and
   first and second parallel vibrating arms having a generally tapered shape;
   wherein each of the vibrating arms is extended from the base by an enlarged portion in the shape of a flipper forming a free end of each arm,
   wherein each of the vibrating arms further includes at least one groove formed on at least one of the top or bottom surfaces of each of the vibrating arms,
   wherein each groove extends in a direction of a free end of an arm to beyond a start of the flipper,
   wherein each of the vibrating arms carries a set of excitation electrodes for vibrating the arms at a fundamental frequency,
   wherein the set of excitation electrodes includes central electrodes on the top and bottom surfaces of the arms and lateral electrodes along the sides of the arms, and
   wherein the central electrodes do not extend all the way to the start of the flippers, but stop before.

2. The piezoelectric tuning fork resonator according to claim 1, wherein the starting point of said groove formed on each of said arms is inside the base, before an arm anchorage zone.

3. The piezoelectric tuning fork resonator according to claim 1, wherein the distance over which the groove extends beyond the start of the flipper is comprised between one or two times the mean width of the arm.

4. The piezoelectric tuning fork resonator according to claim 1, wherein the distance over which the groove extends beyond the start of the flipper is at least three times the depth of the groove.

5. The piezoelectric tuning fork resonator according to claim 1, wherein the end of the groove is closer to the start of the flipper than to the end thereof.

6. The piezoelectric tuning fork resonator according to claim 1, wherein the depth of said grooves is less than 40% of the thickness of the vibrating arms in order to obtain a good compromise between the dimensions of the resonator and the resistance to mechanical stress thereof.

7. The piezoelectric tuning fork resonator according to claim 6, wherein the depth of said grooves is less than 30% of the thickness of the vibrating arms in order to obtain an optimised compromise between the dimensions of the resonator and the resistance to mechanical stress thereof.

8. The piezoelectric tuning fork resonator according to claim 1, wherein said grooves have a rectangular shape in order to reduce the space between the electrodes and further increase the first motional capacitance.

9. The piezoelectric tuning fork resonator according to claim 1, wherein said grooves have a tapered shape in order to prevent short circuits between the electrodes.

* * * * *